United States Patent
Harris

(10) Patent No.: US 10,136,497 B2
(45) Date of Patent: Nov. 20, 2018

(54) LIGHT-EMITTING DIODE (LED) LIGHT SETS

(71) Applicant: Geoffrey Herbert Harris, Chicago, IL (US)

(72) Inventor: Geoffrey Herbert Harris, Chicago, IL (US)

(*) Notice: Subject to any disclaimer, the term of this patent is extended or adjusted under 35 U.S.C. 154(b) by 0 days.

(21) Appl. No.: 15/715,632

(22) Filed: Sep. 26, 2017

(65) Prior Publication Data
US 2018/0020519 A1 Jan. 18, 2018

Related U.S. Application Data

(62) Division of application No. 15/093,256, filed on Apr. 7, 2016, now Pat. No. 9,788,384.

(51) Int. Cl.
| | |
|---|---|
| H05B 33/00 | (2006.01) |
| H05B 33/08 | (2006.01) |
| H05B 37/02 | (2006.01) |
| F21V 23/00 | (2015.01) |
| F21V 23/06 | (2006.01) |
| H01L 33/62 | (2010.01) |
| H01L 33/30 | (2010.01) |
| F21Y 115/10 | (2016.01) |
| H01L 33/50 | (2010.01) |
| F21S 4/10 | (2016.01) |
| F21W 121/00 | (2006.01) |
| F21Y 113/17 | (2016.01) |

(52) U.S. Cl.
CPC ....... *H05B 33/0857* (2013.01); *F21V 23/001* (2013.01); *F21V 23/06* (2013.01); *H05B 37/0281* (2013.01); *F21S 4/10* (2016.01); *F21W 2121/00* (2013.01); *F21Y 2113/17* (2016.08); *F21Y 2115/10* (2016.08); *H01L 33/30* (2013.01); *H01L 33/502* (2013.01); *H01L 33/62* (2013.01)

(58) Field of Classification Search
CPC ............ H05B 33/0803; H05B 33/0818; H05B 33/0857
See application file for complete search history.

(56) References Cited

U.S. PATENT DOCUMENTS

2004/0257007 A1  12/2004  Lys et al.

OTHER PUBLICATIONS

Mar. 17, 2017 U.S. Non-Final Office Action—U.S. Appl. No. 15/093,256.
Jul. 3, 2018—(US) Office Action—U.S. Appl. No. 15/715,697.

*Primary Examiner* — Monica C King
(74) *Attorney, Agent, or Firm* — Banner & Witcoff, Ltd.

(57) ABSTRACT

Apparatuses and systems are provided for changing the spectrum of light emission from a light-emitting diode (LED) light set. The LED light set may include LEDs, each of which having at least a first LED chip and a second LED chip configured to emit light at differing wavelengths. The first and second LED chips may be connected in series with opposite polarities. Responsive to receiving a power flow in a first direction from a power terminal, the first LED chip may emit light of a first color while the second LED chip may remain powered off. Responsive to receiving the power flow in a second direction opposite the first direction from the power source, the second LED chip may emit light of a second color different from the first color while the first LED chip may remain powered off.

20 Claims, 8 Drawing Sheets

LIGHT-EMITTING DIODE (LED) LIGHT SETS

CROSS REFERENCE TO RELATED APPLICATIONS

This application is a divisional of and claims priority to co-pending U.S. application Ser. No. 15/093,256, filed Apr. 7, 2016, and entitled "Light-Emitting Diode (LED) Light Sets," which is incorporated herein by reference in its entirety.

FIELD

Aspects described herein generally relate to light-emitting diode (LED) light sets. More specifically, aspects relate to changing the color emission of LED light sets.

BACKGROUND

The use of light sets as decorations for holidays such as Christmas and Halloween is conventional. However, in most instances, such lights are only capable of emitting light in a single holiday-specific color arrangement in accordance with the traditional colors of the holiday (e.g., red, green, etc. for Christmas, orange for Halloween, and the like). Accordingly, decorative light sets need to be swapped out between holiday seasons to ensure cohesion with holiday color schemes.

In other instances, complex light strips may be able to achieve varying spectrums of light emission. While such strips may enable assimilation with traditional color arrangements of a multitude of holidays, they require expensive RGB color LEDs, extra wiring to each LED to allow for controllability, a microcontroller to dictate color emission of the LEDs, and a remote control to engage with the microcontroller to enable user control over the light emission.

Accordingly, there exists a need for ways to change the color emission of LED light sets in a less expensive and simple fashion.

BRIEF SUMMARY

The following presents a simplified summary of various aspects described herein. This summary is not an extensive overview, and is not intended to identify key or critical elements or to delineate the scope of the claims. The following summary merely presents some concepts in a simplified form as an introductory prelude to the more detailed description provided below.

To overcome limitations in the prior art described above, and to overcome other limitations that will be apparent upon reading and understanding the present specification, aspects described herein are directed to apparatuses and systems for changing the spectrum of light emission of LED light sets.

A first aspect described herein provides an LED configured to emit light of either a first or second wavelength depending on a direction of power flow into the LED. The LED may include at least a first LED chip configured to emit light of a first wavelength and a second LED chip configured to emit light of a second wavelength different than the first wavelength. The first and second LED chips may be connected in series with opposite polarity. The LED may be connected by a wire to a power terminal. The power terminal may be configured to produce a power flow through the wire, and may include an A/B switch configured to switch the direction of the power flow between a first and second direction through the wire. Responsive to receiving power flow in the first direction from the power terminal, the first LED chip may be configured to activate and/or power on, while the second LED chip may be configured to remain powered off. Responsive to receiving power flow in the second direction opposite the first direction, the second LED chip may be configured to activate and/or power on, while the first LED chip may be configured to remain powered off.

A second aspect described herein provides an LED configured to emit light of either a first or second wavelength depending on a direction of power flow into the LED. The LED may include at least a first LED chip configured to emit light of a first wavelength and a second LED chip configured to emit light of a second wavelength different than the first wavelength. The first and second LED chips may be connected in series with opposite polarity. The LED may be connected by a wire to a power terminal. The power terminal may be configured to produce a power flow through the wire, which may be connected to the power terminal through a first inline connector and a second inline connector. The direction of the power flow through the wire may be switched between a first direction and a second direction by changing a connection of the first inline connector and the second inline connector with the power terminal. Responsive to receiving power flow in the first direction from the power terminal, the first LED chip may be configured to activate and/or power on, while the second LED chip may be configured to remain powered off. Responsive to receiving power flow in the second direction opposite the first direction, the second LED chip may be configured to activate and/or power on, while the first LED chip may be configured to remain powered off.

A third aspect described herein provides for an LED light tree comprising a plurality of LEDs. The LED light tree may include a support apparatus housing each of the plurality of LEDs. The support apparatus may include a trunk portion, a plurality of branch portions connected to the trunk portion, and a plurality of twig portions connected to the plurality of branch portions. The LEDs may be housed in each of the respective portions of the support apparatus and may be of a certain type depending on the portion in which they are housed. Each of the LEDs of the plurality of LEDs may include at least a first LED chip configured to emit light of a first wavelength and a second LED chip configured to emit light of a second wavelength different than the first wavelength. The first and second LED chips may be connected in series with opposite polarity. Responsive to receiving power flow in a first direction from a power source, the first LED chip of each of the plurality of LEDs may be configured to activate and/or power on, while the second LED chip of each of the plurality of LEDs may be configured to remain powered off. Responsive to receiving power flow in a second direction opposite the first direction, the second LED chip of each of the plurality of LEDs may be configured to activate and/or power on, while the first LED chip of each of the plurality of LEDs may be configured to remain powered off.

BRIEF DESCRIPTION OF THE DRAWINGS

A more complete understanding of aspects described herein and the advantages thereof may be acquired by referring to the following description in consideration of the accompanying drawings, in which like reference numbers indicate like features, and wherein.

DETAILED DESCRIPTION

In the following description of the various embodiments, reference is made to the accompanying drawings, which illustrate various embodiments in which aspects described herein may be practiced. It is to be understood that other embodiments may be utilized and structural and functional modifications may be made without departing from the scope of the described aspects and embodiments. Aspects described herein are capable of other embodiments and of being practiced or being carried out in various ways. Also, it is to be understood that the phraseology and terminology used herein are for the purpose of description and should not be regarded as limiting. Rather, the phrases and terms used herein are to be given their broadest interpretation and meaning. The use of "including" and "comprising" and variations thereof is meant to encompass the items listed thereafter and equivalents thereof as well as additional items and equivalents thereof. The use of the terms "mounted," "connected," "coupled," "positioned," "engaged" and similar terms, is meant to include both direct and indirect mounting, connecting, coupling, positioning and engaging.

Figure 1:
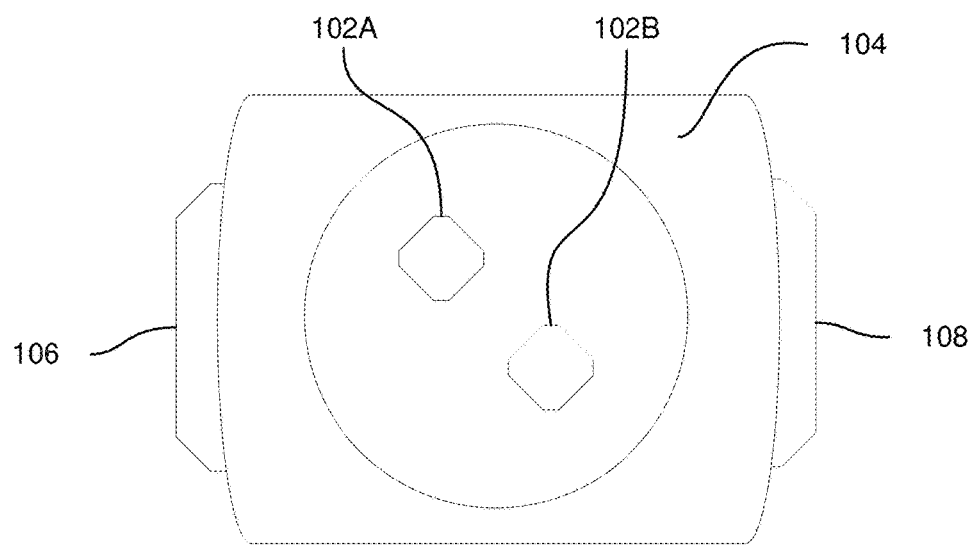
FIG. 1 is a diagram illustrating an LED that may be used to implement aspects of the disclosure.

FIG. 1 illustrates an LED 100 that may be used according to one or more illustrative embodiments of the disclosure. LED 100 may be a miniature, low-current, low-power, standard, ultra-high-output, high-power, AC driven, flashing, bi-color, tri-color, decorative-multicolor, or filament LED depending on the embodiment. LED 100 may include LED chip 102A, LED chip 102B, casing 104, anode terminal 106, and cathode terminal 108. In some instances, LED 100 may include additional LED chips, anode terminals, and cathode terminals similar to LED chip 102A or 102B, anode terminal 106, and cathode terminal 108.

LED chips 102A and 102B of LED 100 may be solid-state semiconductor devices configured to convert electricity into specific wavelengths of light. LED chips 102A and 102B may be made of any of a number of semiconductor materials including gallium arsenide, aluminum gallium arsenide, gallium arsenide phosphide, aluminum gallium indium phosphide, gallium (III) phosphide, aluminum gallium phosphide, indium gallium nitride, gallium (III) nitride, zinc selenide, silicon carbide, silicon, diamond, boron nitride, aluminum nitride, aluminum gallium nitride, aluminum gallium indium nitride, and the like. Such semiconductor materials may be used alone, or in combination. Additionally, the semiconductor materials may be coated and/or wrapped in phosphor or plastic to produce additional wavelengths/colors of light. In some instances, other types of materials may be used.

Depending on the types of semiconductor materials of LED chips 102A and 102B, the chips may be configured to emit wavelengths of light corresponding to infrared, red, orange, yellow, green, blue, violet, purple, ultraviolet, pink, white, or combinations thereof. Accordingly, LED chip 102A may be made of a first material and may be configured to emit a first wavelength of light and LED chip 102B may be made of a second material different than the first material and may be configured to emit a second wavelength of light different than the first wavelength of light. For example, LED chip 102A may be made of gallium (III) phosphide and may be configured to emit green light and LED chip 102B may be made of gallium arsenide phosphide and may be configured to emit orange light. In certain embodiments, LED chips 102A and 102B may be made of the same material and may be configured to emit the same wavelength of light.

LED chips 102A and 102B may be connected in series with a same polarity and may be configured to emit light simultaneously (e.g., both LED chip 102A and 102B are activated and/or powered on and emitting light at the same time). Alternatively, LED chips 102A and 102B may be connected in series with an opposite polarity and may be configured to emit light in the alternate (e.g., when LED chip 102A is activated and/or powered on and emitting light, LED chip 102B is not activated and/or powered on and not emitting light).

In instances where additional LED chips 102 are included in LED 100, each LED chip of a plurality of additional LED chips may be connected in series with the same polarity and may be configured to emit light simultaneously (e.g., all LED chips of the plurality of LED chips in LED 100 are activated and/or powered on and emitting light at the same time). Alternatively, each LED chip of a plurality of additional LED chips may be connected in series with alternating polarity and may be configured to emit light in the alternate (e.g., every other LED chip of the plurality of LED chips in LED 100 are activated and/or powered on and emitting light). Furthermore, the plurality of LED chips may be grouped in alternating like-polarity increments and may be configured to emit light in the group alternate (e.g., every other group of three LED chips of the plurality of LED chips in LED 100 are activated and/or powered on and configured to emit light at the same time). Such groupings of LED chips may be symmetric or asymmetric depending on the embodiment.

LED chips 102A and 102B may be attached to casing 104. Casing 104 may be made of any one, or combination of, metals, polymers, ceramics, and/or composites. In some embodiments, casing 104 may encapsulate LED chips 102A and 102B. In such embodiments, casing 104 may be either waterproof or non-waterproof. Furthermore, casing 104 may be colored and, as such, may be configured to alter the end light emission spectrum. In other embodiments, casing 104 may be a surface to which LED chips 102A and 102B are attached and may not encapsulate the chips.

LED 100 may be a polarized component and may include anode terminal 106 and cathode terminal 108. Anode terminal 106 may be alternatively identified as a positive terminal and may be configured to receive a positive voltage input. Cathode terminal 108 may be alternatively identified as a negative terminal and may be configured to receive a negative voltage input. However, in certain embodiments, terminals 106 and 108 may be identified as a first terminal and a second terminal, respectively, and may be configured to receive either a positive or negative voltage input.

Figure 2:
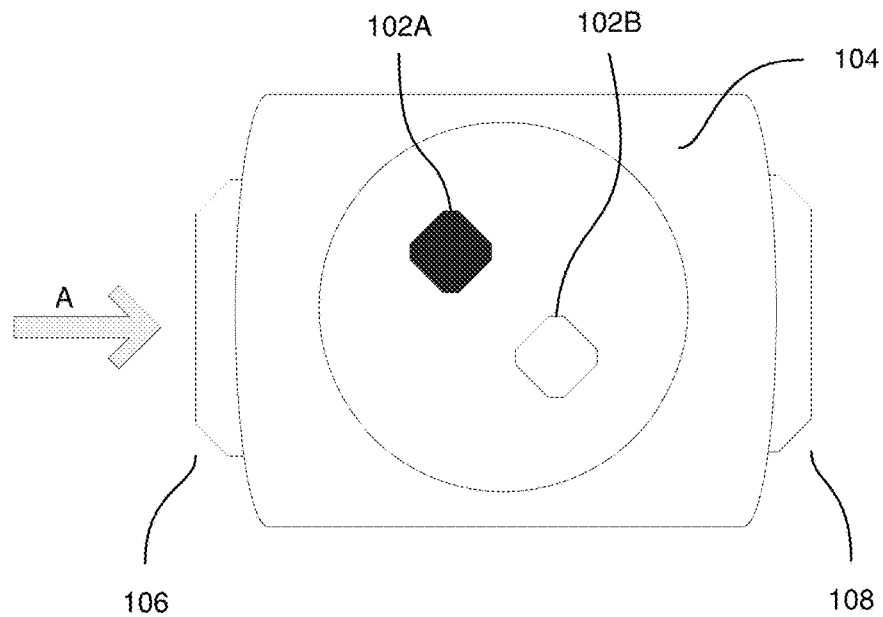
FIG. 2 is a diagram illustrating a first example of power flow and corresponding LED chip activation according to one or more aspects of the disclosure.

As shown in FIG. 2, LED chip 102A may be configured to activate and/or power on and emit a first wavelength of light when power flow A enters LED 100 through first terminal 106. Conversely, LED chip 102B may not be configured to activate and/or power on under such a direction of power flow. In some embodiments, both LED chips 102A and 102B may be configured to activate and/or power on when power flow A enters LED 100 through first terminal 106. Alternatively, both LED chips 102A and 102B may not be configured to activate and/or power on under such a direction of power flow.

Figure 3:
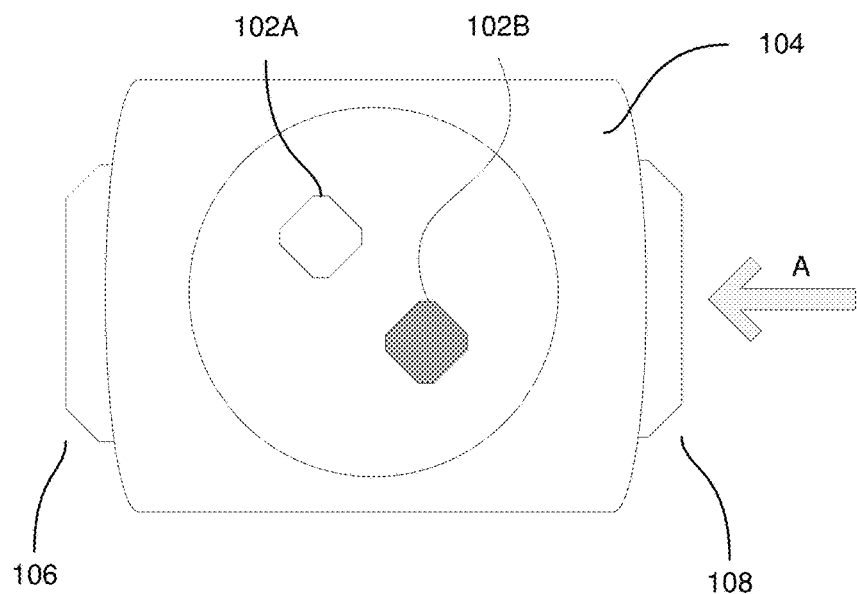
FIG. 3 is a diagram illustrating a second example of power flow and corresponding LED activation according to one or more aspects of the disclosure.

As shown in FIG. 3, LED chip 102B may be configured to activate and/or power on and emit a second wavelength of light different than the first wavelength as discussed above when power flow A enters LED 100 through second terminal 108. Conversely, LED chip 102A may not be configured to activate and/or power on under such a direction of power flow. In some embodiments, both LED chips 102A and 102B may be configured to activate and/or power on when power flow A enters LED 100 through second terminal 108. Alternatively, both LED chips 102A and 102B may not be configured to activate and/or power on under such a direction of power flow.

Figure 4:
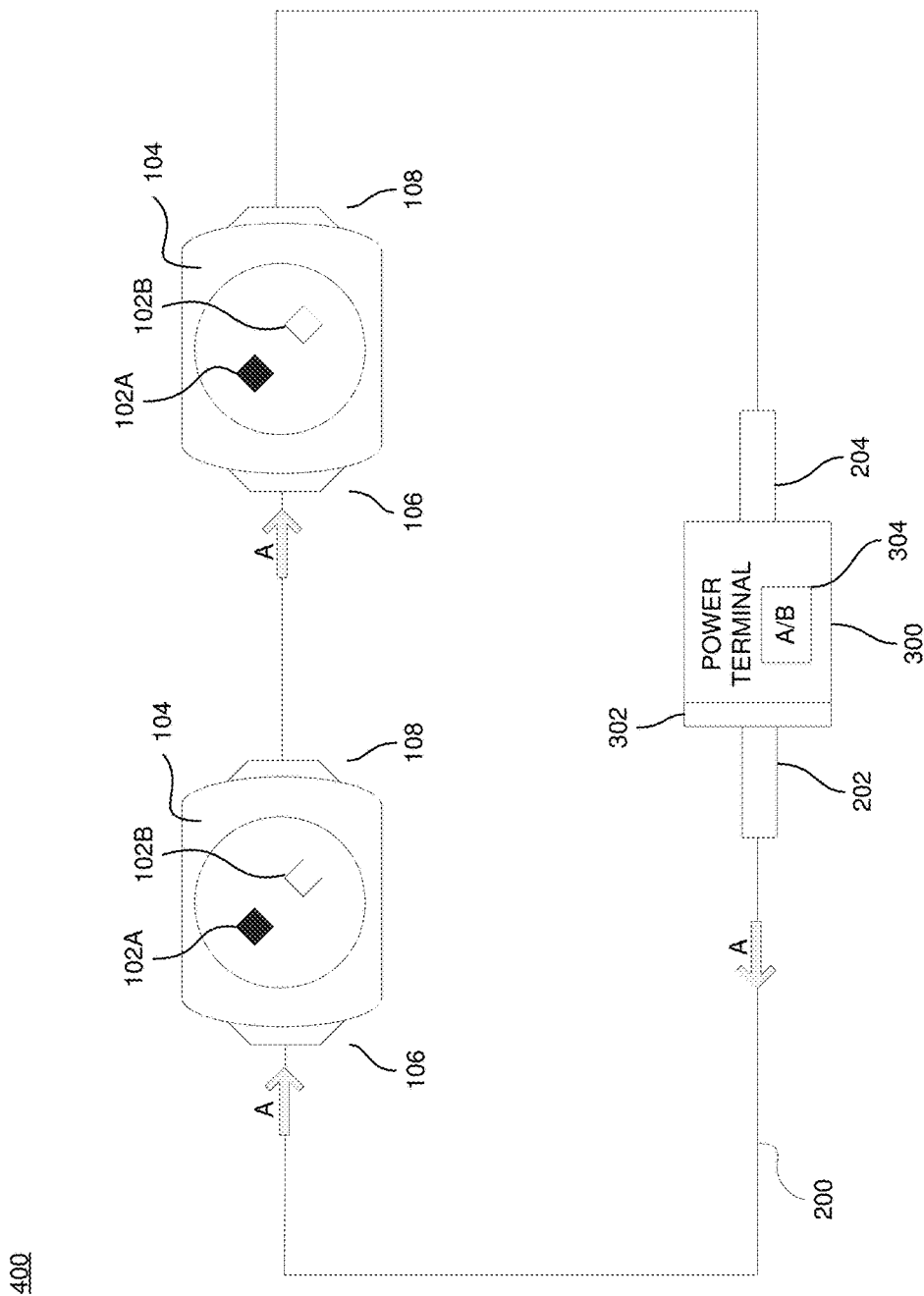
FIG. 4 is a diagram illustrating a first example of power flow and corresponding LED chip activation in an LED system according to one or more aspects of the disclosure.

FIG. 4 illustrates an LED system 400 according to one or more embodiments of the present disclosure. LED system 400 may include one or more LEDs 100, each of which including the above-mentioned components (e.g., at least LED chips 102A and 102B, casing 104, at least first terminal 106 and second terminal 108), wire 200, and power terminal 300.

Each of the one or more LEDs 100 may be connected in series to each other via wire 200. The first and last LEDs 100 of the series of LEDs may be connected to power terminal 300 via wire 200. Accordingly, wire 200 may be configured to connect power terminal 300 to each of the LEDs 100 in the series of LEDs in a loop. Wire 200 may be a wire, string, and/or cable and may be comprised of any of a plurality of conductive materials including, but not limited to, copper and aluminum. Wire 200 may be an insulated wire or may be an uninsulated wire depending on the embodiment. Furthermore, wire 200 may be a rigid, semi-rigid, or flexible wire allowing for pliability, or lack thereof.

In certain embodiments, wire 200 may contain a first terminal end 202 and a second terminal end 204. The first terminal end 202 and second terminal end 204 may be configured to be plugged and/or unplugged from a power output portion 302 of power terminal 300. Accordingly, the polarity of wire 200 may be reversible by interchanging the connection of the first terminal end 202 and second terminal end 204 with a power output portion 302 of power terminal 300 as will be discussed in further detail below. In certain embodiments, the first terminal end 202 may be known as a first inline connector, and the second terminal end 204 may be known as a second inline connector.

Power terminal 300 may be configured so as to provide electrical energy to the one or more LEDs 100 of LED system 400. Power terminal 300 may include solar panels/cells mounted thereon so as to translate solar energy into electrical energy for storage in the power terminal 300. In other embodiments, power terminal 300 may include one or more exhaustible batteries, one or more rechargeable batteries (e.g., 18650 Lithium Ion batteries or other suitable rechargeable batteries), or the like. In some instances, the power terminal 300 may be connected indirectly to an AC power source via a power transformer (not shown). The power transformer may be integral with power terminal 300 or may be an ancillary adapter. The power transformer may be able to translate energy into a form acceptable by the one or more LEDs 100. Such energy sources and/or translation methods may be used alone, or in combination.

As stated above, the power terminal 300 may be configured to engage and/or disengage with the first terminal end 202 and the second terminal end 204 of wire 200. Accordingly, power terminal 300 may be configured to output power through either the first or second terminal end depending on the orientation of engagement/polarity of the terminal ends of wire 200 relative to a power output portion 302 of power terminal 300. For example, in instances where the first terminal end 202 of wire 200 is engaged with the power output portion 302 of power terminal 300, power flow A may flow through the first terminal end 202. Alternatively, in instances where the second terminal end 204 of wire 200 is engaged with the power output portion 302 of power terminal 300, power flow A may flow through the second terminal end 204. In such instances, power output portion 302 may be a fixed and/or static power output portion.

In certain embodiments, power terminal 300 may further include A/B switch 304 which can be used to reorient power output portion 302 and reverse the direction of power flow A into wire 200 from the first terminal end 202 to the second terminal end 204 or vice versa. In such embodiments where power terminal 300 includes A/B switch 304, the first and second terminal ends of wire 200 may be rigidly attached to power terminal 300 and power output portion 302 may be an alterable and/or dynamic power output portion. However, the first terminal end 202 and second terminal end 204 of wire 200 may be configured to engage and/or disengage with power terminal 300 in addition to the presence of A/B switch 304.

Depending on the direction of power flow A from power terminal 300, one or more LED chips comprised within the one more or more LEDs 100 may activate and/or power on and emit light. For example, as shown in FIG. 4, when power flow A enters the first terminal 106 of one or more LEDs 100, LED chips 102A may activate and/or power on and emit light of a first wavelength (e.g., red). In certain embodiments, the LED chips 102A of each of the plurality of LEDs 100 may exhibit any of a range of wavelength profiles (e.g., red, green, blue, yellow, white, etc.). The pattern of wavelength profiles for the LED chips 102A of each of the LEDs 100 connected in the series of LEDs may be homogeneous (e.g., red, red, red, red, etc.), heterogeneous and symmetric (e.g., red, red, yellow, yellow, green, green, etc.), heterogeneous and asymmetric (e.g., red, red, yellow, green, blue, blue, orange, white, etc.), or heterogeneous and random (e.g., red, green, blue, purple, yellow, etc.).

Figure 5:
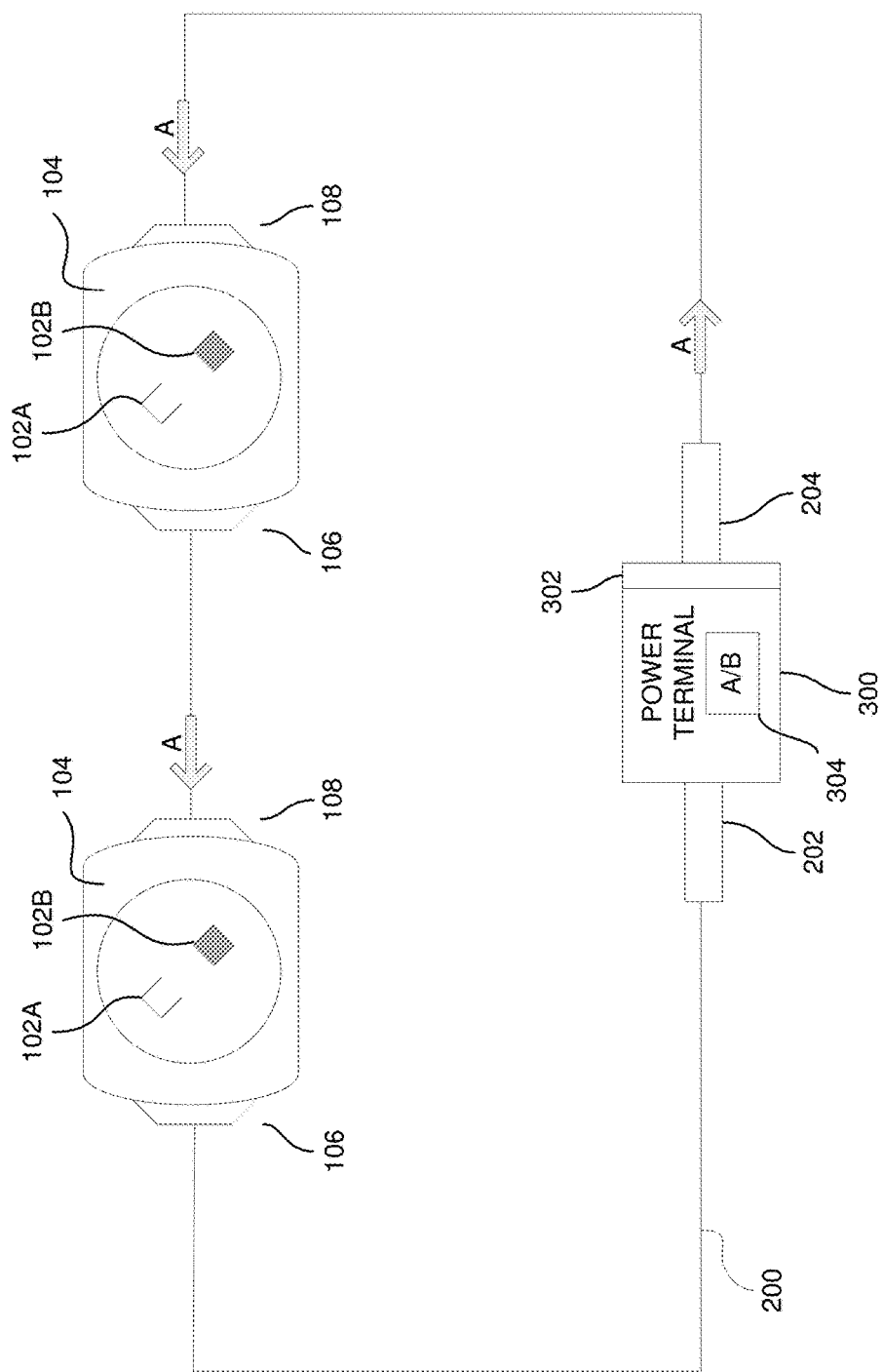
FIG. 5 is a diagram illustrating a second example of power flow and corresponding LED chip activation in an LED system according to one or more aspects of the disclosure.

As shown in FIG. 5, when power flow A enters the second terminal 108 of one or more LEDs 100, LED chips 102B may activate and/or power on and emit light of a second wavelength different than the first wavelength. In certain embodiments, the LED chips 102B of each of the plurality of LEDs 100 may exhibit any of a range of wavelength profiles (e.g., red, green, blue, yellow, white, etc.). The pattern of wavelength profiles for the LED chips 102B of each of the LEDs 100 connected in the series of LEDs may be homogeneous (e.g., blue, blue, blue, blue, etc.), heterogeneous and symmetric (e.g., blue, blue, orange, orange, purple, purple, etc.), heterogeneous and asymmetric (e.g., blue, blue, orange, purple, yellow, yellow, green, white, etc.), or heterogeneous and random (e.g., red, green, blue, purple, yellow, etc.).

Through reversing the polarity of the terminal ends of wire 200 relative to the power output portion 302 and/or reversing the direction of power flow A into wire 200 via actuation of A/B switch 304, at least two different color patterns may be realized. For example, as described above in regards to FIG. 4, when power flow A enters the first terminal 106 of one or more LEDs 100, LED chips 102A may activate and/or power on and emit light of a first wavelength and/or first range of wavelengths. The first wavelength and/or first range of wavelengths may be associated with a first color pattern of, for example, a first season (e.g., spring, summer, fall, winter) or holiday (e.g., Fourth of July, Halloween, Easter, Christmas, etc.). Conversely, as described in regards to FIG. 5, when power flow A enters the second terminal 108 of one or more LEDs 100, LED chips 102B may activate and/or power on and emit light of a second wavelength and/or second range of wavelengths different than the first wavelength and/or first range of wavelengths. The second wavelength and/or second range of wavelengths may be associated with a second color pattern of, for example, a second season or holiday, wherein the second color pattern is different than the first color pattern.

Alternatively, the LED chips 102A and 102B of LEDs 100 may be respectively configured to emit one of colored or non-colored light. For example, when power Flow A enters the first terminal 106 of one or more LEDs 100, LED chips 102A may be configured to emit white light. However, when power flow A enters the second terminal 108 of one or more LEDs 100, LED chips 102B may be configured to emit colored light (e.g., red, orange, yellow, green, blue, purple, etc.). In the manner described herein, reversing the polarity of wire 200 relative to power terminal 300 and/or reversing the direction of power flow A into wire 200 via actuation of A/B switch 304 allows for at least two different light patterns to be achieved.

While not explicitly shown in FIG. 4 or 5, A/B switch 304 may include a timer. The timer of A/B switch 304 may be any one of a mechanical, electrical, or electromechanical timer and may be configured to turn on/off at a specified time for a specified time interval (e.g., turn on for one hour starting at 8 PM, turn off for eight hours starting at midnight, etc.). The time and time interval may be specified by a user, or may be predetermined. Alternatively and/or additionally, the timer may be a 24 hour timer and may be configured to turn on/off at a specified time for a specified time interval each day (e.g., everyday turn on for five hours starting at 6 PM). In some instances, multiple times and time intervals may be set.

In certain embodiments, the timer may be configured to terminate power flow A from power terminal 300 to wire 200 during either the on or off period. For example, the timer may be set by a user and/or may be predetermined to turn on for an eight hour period starting at 7 PM. During the time period in which the timer is off (e.g., 3 AM to 7 PM), the timer may be configured to inhibit power flow A from power terminal 300 to wire 200, and thereby prevent light emission from the one or more LEDs 100. Conversely, during the time period from 7 PM to 3 AM in which the timer is on, the timer may be configured to allow power flow A from terminal 300 to wire 200, and thereby allow light emission from the one or more LEDs 100.

In other embodiments, the timer, in conjunction with A/B switch 304, may be configured to reorient power output portion 302 and reverse the direction of power flow A into wire 200 from the first terminal end 202 to the second terminal end 204 or vice versa at a specified time for a specified time interval. For example, the timer may be set to turn on for a three hour period starting at 6 PM. During the period in which the timer is off (e.g., from 9 PM to 6 PM), the timer may be configured to cause A/B switch 304 to orient power output portion 302 in line with the first terminal end 202 and cause power flow A to enter wire 200 through the first terminal end 202. During such a time period, each of the LED chips 102A of the one or more LEDs 100 may be configured to activate and/or power on and emit light of a first wavelength. Conversely, during the time period from 6 PM to 9 PM in which the timer is on, the timer may be configured to cause A/B switch 304 to reorient power output portion 302 from the first terminal end 202 to the second terminal end 204 and cause power flow A to enter wire 200 through the second terminal end 204. During such a time period, each of the LED chips 102B of the one or more LEDs 100 may be configured to activate and/or power on and emit light of a second wave length different the first wavelength.

Figure 6:
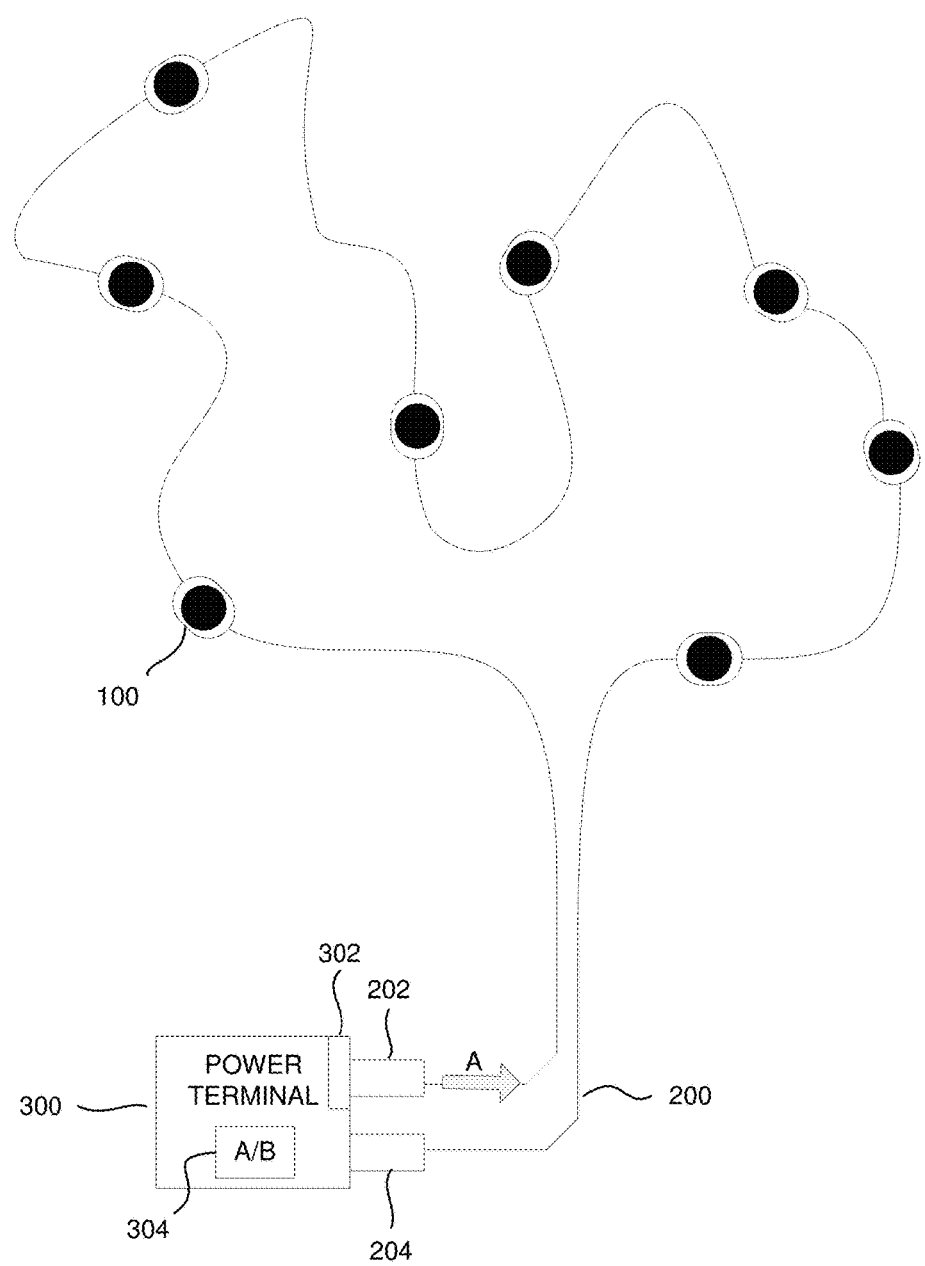
FIG. 6 is a diagram illustrating an LED string and a first example of LED chip activation according to one or more aspects of the disclosure.

FIG. 6 depicts an LED string 600 according to one or more aspects of the disclosure. LED string 600 may be configured for indoor and/or outdoor use and may be configured to be hung from any of a plurality of objects including, but not limited to, a house façade, tree, bush, door frame, wall, ceiling, and the like. LED string 600 may include one or more LEDs 100, each of which comprising the above-mentioned components (e.g., at least LED chips 102A and 102B, casing 104, at least first terminal 106 and second terminal 108), wire 200, and power terminal 300. Additionally, each component of LED string 600 may have some or all of the structural components described above in regard to LED system 400.

Wire 200 may be a thermoplastic sheathed electrical wire and may be configured to form a waterproof seal with the first terminal 106 and second terminal 108 of each of the one or more LEDs 100. In certain embodiments, wire 200 may be fixedly attached to each of the one or more LEDs 100. However, in other embodiments, wire 200 may be configured to be attached and/or detached from each LED 100 in LED string 600. Accordingly, each of the one or more LEDs 100 may be removable and/or replaceable. For example, if an LED 100 ceases to emit light, the LED 100 may be removed from LED string 600 and replaced with a new and/or functioning LED. Similarly, if a segment of wire 200 fails, the particular segment may be detached and/or replaced in LED string 600. In certain embodiments, segments of wire 200 including one or more LEDs 100 may be added and/or removed from LED string 600 so as to increase and/or decrease the overall length of LED string 600.

The LEDs 100 of LED string 600 may be of a similar type (e g, miniature, low-current, low-power, high-power, flashing, bi-color, tri-color, etc.) or may be any of a range of types. The pattern of LED types of the LEDs 100 of LED string 600 may be homogeneous (e.g., high-power, high-power, etc.), heterogeneous and symmetric (e.g., flashing, high-power, high-power flashing, etc.), heterogeneous and asymmetric (e.g., high-power, high-power flashing, bi-color, tri-color, tri-color, high-power, flashing, etc.), or heterogeneous and random (e.g., high-power, flashing, bi-color, tri-color, etc.).

Figure 7:
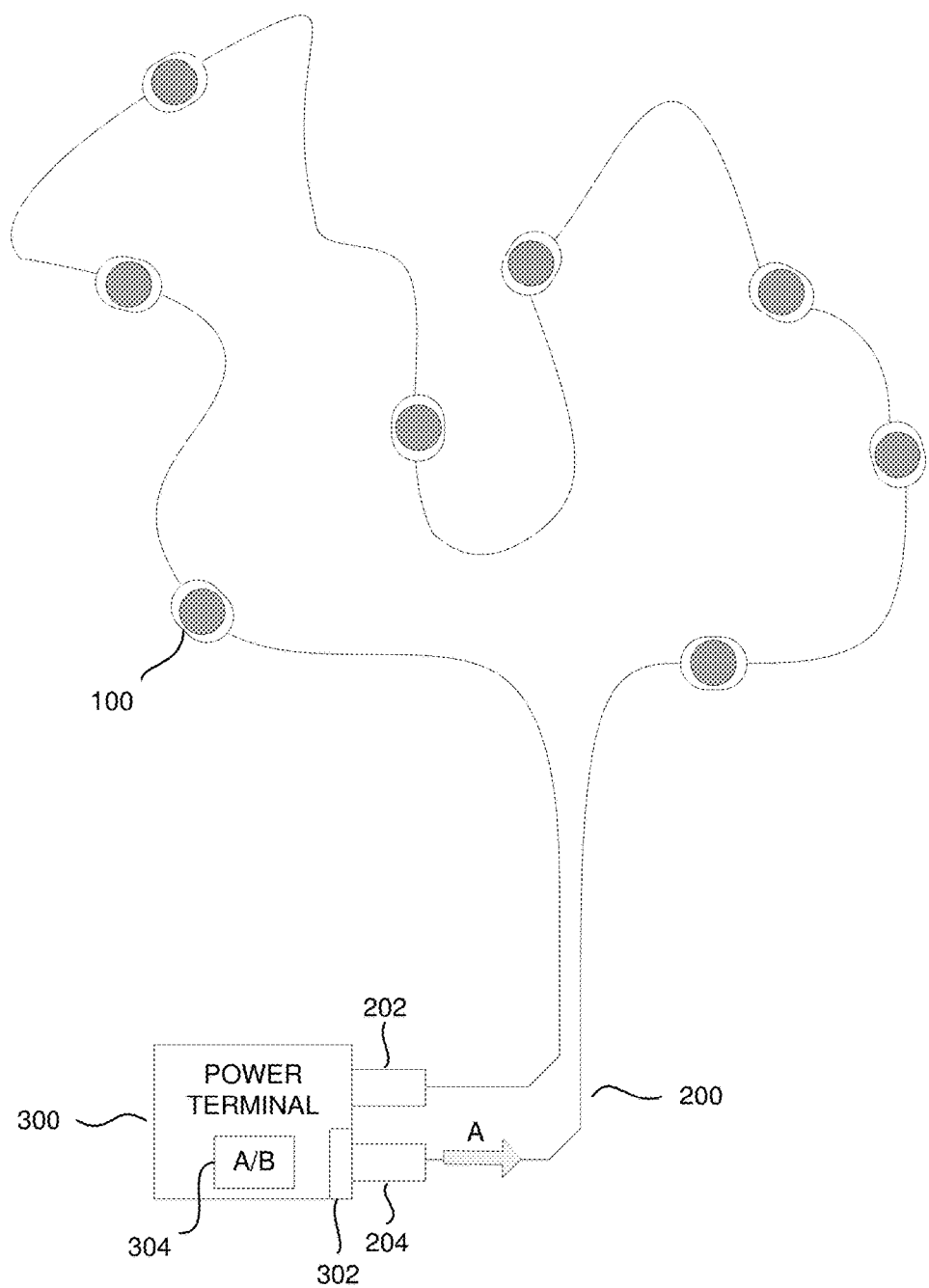
FIG. 7 is a diagram illustrating an LED string and a second example of LED chip activation according to one or more aspects of the disclosure.

While not explicitly shown in FIG. 6 and FIG. 7, LED chips 102A and 102B may be included within the one or more LEDs 100. The LED chips of the one or more LEDs 100 may be configured to activate and/or power on when power flow A traverses wire 200. For example, when power flow A enters the first terminal end 202 of wire 200 and flows through the first terminal of each of the one or more LEDs 100, LED chip 102A may activate and/or power on. Conversely, when the direction of power flow A is reversed to enter the second terminal end 202 of wire 200 and flow through the second terminal of each of the one or more LEDs 100, LED chip 102B may activate and/or power on.

Figure 8:
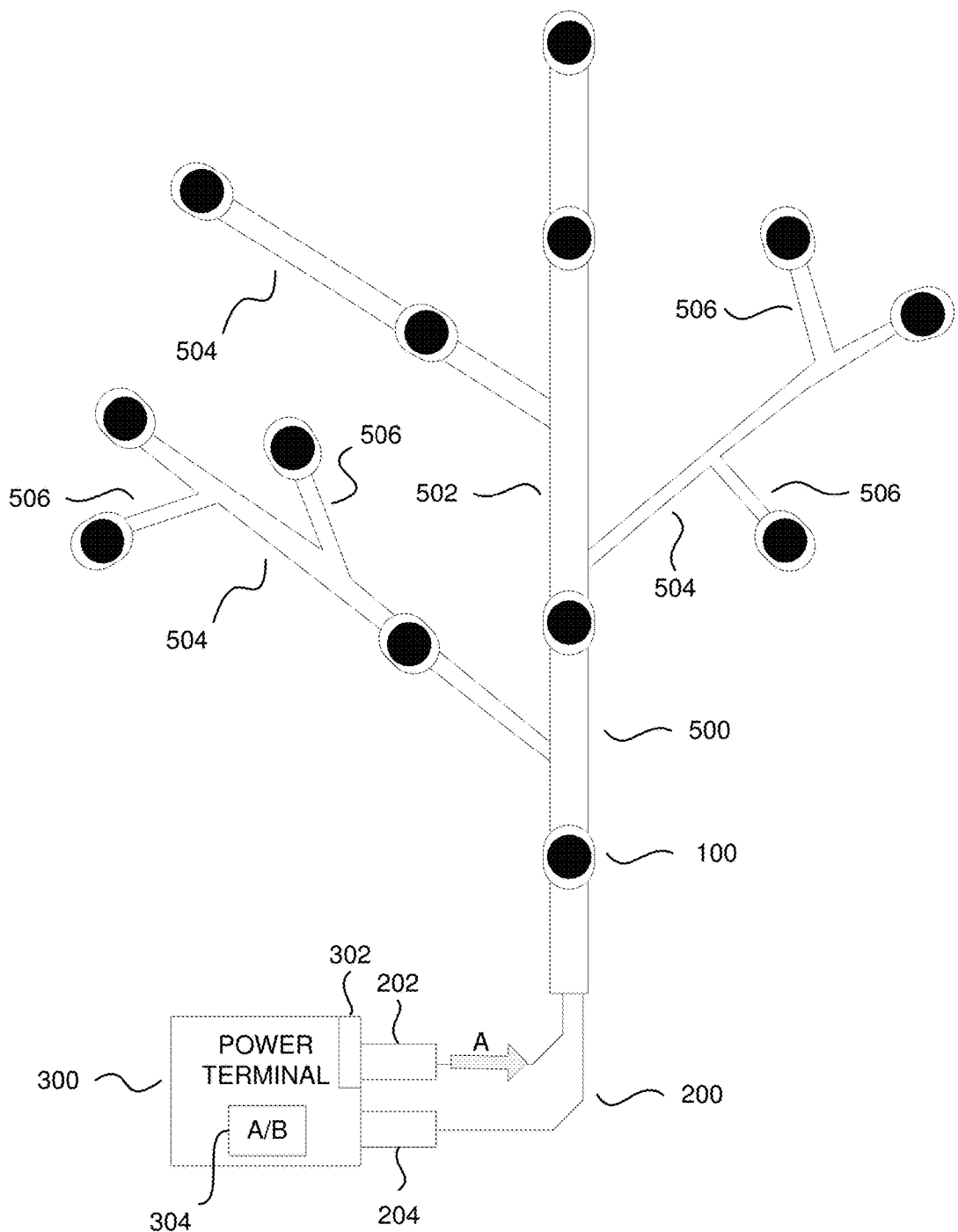
FIG. 8 is a diagram illustrating an LED tree and a first example of LED chip activation according to one or more aspects of the disclosure.

FIG. 8 depicts an LED tree 800 according to one or more aspects of the disclosure. LED tree 800 may be configured for indoor and/or outdoor use and may be configured to stand upright, to be inserted into a support (e.g., ground, bush, tree, flower arrangement, etc.), and/or hang from any of a plurality of objects including, but not limited to, a house façade, tree, bush, door frame, wall, ceiling, and the like. LED tree 800 may include one or more LEDs 100, each of which comprising the above-mentioned components (e.g., at least LED chips 102A and 102B, casing 104, at least first terminal 106 and second terminal 108), wire 200, power terminal 300, and housing apparatus 500. Additionally, each component of LED tree 800 may have some or all of the structural components described above in regard to LED system 400.

Wire 200 and each of the one or more LEDs 100 may be included within support apparatus 500. Support apparatus 500 may be made of plastic, metal, or a combination thereof and may include a trunk portion 502, branch portions 504 attached to the trunk portion 502, and twig portions 506 attached to the branch portions 504. In some instances, the trunk portion 502 of support apparatus 500 may be a rigid body offering minimal pliability. The branch portions 504 may be attached to the trunk portion 502 and may be semi-rigid members allowing for bending and/or positioning. The twig portions 506 may be attached to the branch portions 504 and may be flexible members allowing for additional bending and/or positioning. However, in certain embodiments, twig portions 506 may not be attached to branch portion 504. The trunk portion 502, branch portions 504, and twig portions 506 of support apparatus 500 may all be rigid, semi-rigid, or flexible members.

The LEDs 100 included within support apparatus 500 may be of a similar type (e.g., miniature, low-current, low-power, high-power, flashing, bi-color, tri-color, etc.) or may be any of a range of types. The pattern of LED types of the LEDs 100 of LED tree 800 may be homogeneous (e.g., high-power, high-power, etc.), heterogeneous and symmetric (e.g., flashing, high-power, high-power, flashing, etc.), heterogeneous and asymmetric (e.g., high-power, high-power flashing, bi-color, tri-color, tri-color, high-power, flashing, etc.), or heterogeneous and random (e.g., high-power, flashing, bi-color, tri-color, etc.).

Furthermore, the pattern of LED types of LEDs 100 may be determined based on the portion of support apparatus 500 in which they are contained (e.g., trunk portion 502, branch portion 504, and twig portion 506). For example, LEDs 100 included within trunk portion 502 may be of a first type (e.g., high-power), LEDs 100 included within branch portions 504 may be of a second type different than the first type (e.g., low-power), and LEDs 100 included with twig portions 506 may be of a third type different from the first and second types (e.g., flashing).

Additionally, the pattern of LED wavelength profiles for each LED chip 102A and 102B of LEDs 100 in LED tree 800 may be determined based on the portion of support apparatus 500 in which they are contained. For example, LED chips 102A of LEDs 100 in trunk portion 502 may be configured to emit light of a first color (e.g., red), LED chips 102A of LEDs 100 in branch portions 504 may be configured to emit light of a second color different than the first color (e.g., green), and LED chips 102 of LEDs 100 in twig portions 506 may be configured to emit light of a third color different than the first and second colors (e.g., white).

Figure 9:
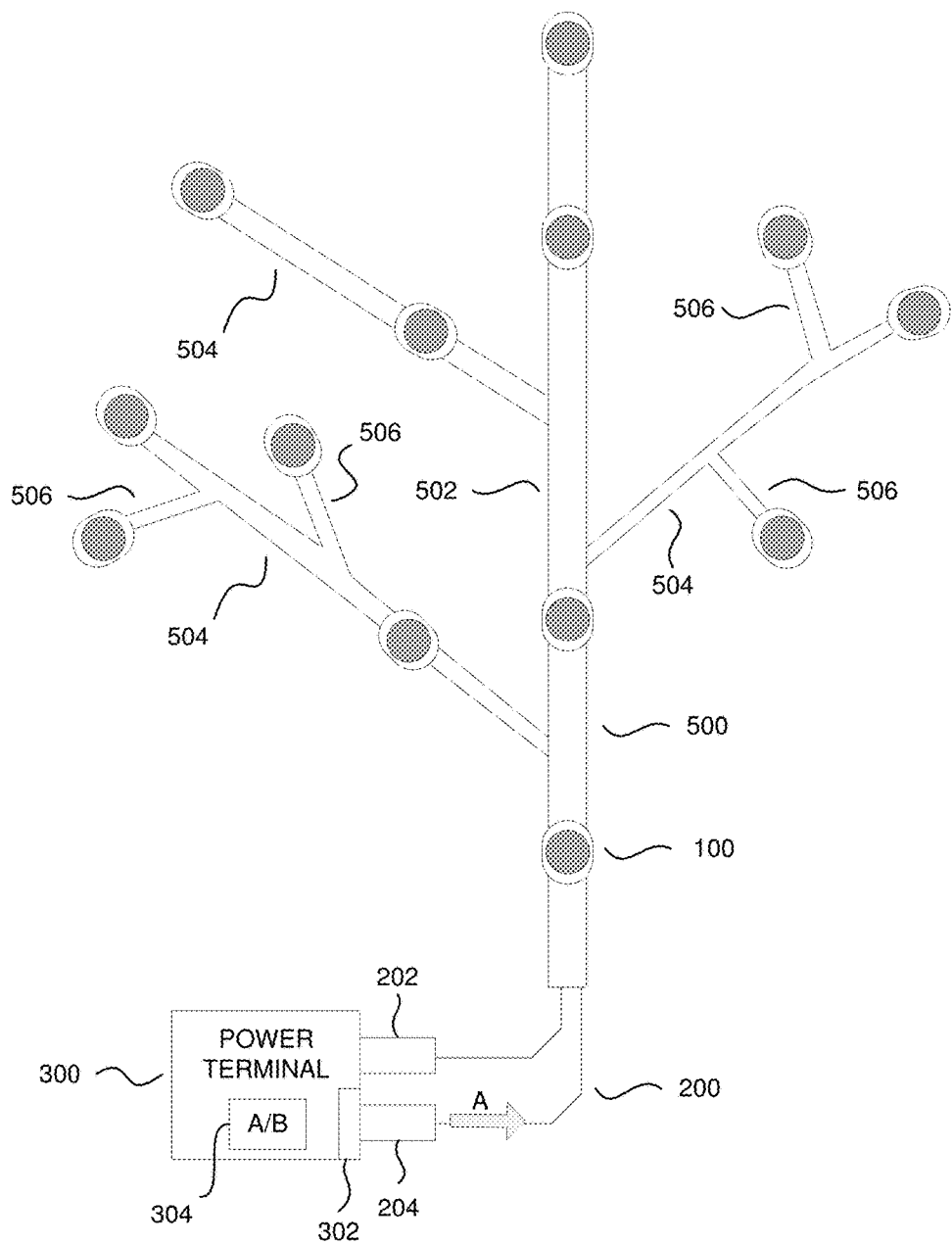
FIG. 9 is a diagram illustrating an LED tree and a second example of LED chip activation according to one or more aspects of the disclosure.

While not explicitly shown in FIG. 8 and FIG. 9, LED chips 102A and 102B may be included in the one or more LEDs 100. The LED chips of the one or more LEDs 100 may be configured to activate and/or power on when power flow A traverses wire 200. For example, when power flow A enters the first terminal end 202 of wire 200 and flows through the first terminal of each of the one or more LEDs 100, LED chip 102A may activate and/or power on. Conversely, when the direction of power flow A is reversed to enter the second terminal end 202 of wire 200 and flow through the second terminal of each of the one or more LEDs 100, LED chip 102B may activate and/or power on.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A system comprising:
   a power terminal configured to produce a power flow through a wire in either a first direction or a second direction opposing the first direction, the power terminal including an A/B switch configured to switch the power flow between the first direction and the second direction; and
   a support apparatus configured to encapsulate the wire, the support apparatus including:
   a trunk portion;
   a plurality of branch portions connected to the trunk portion; and
   a plurality of twig portions connected to the plurality of branch portions,
   wherein the trunk portion, each of the plurality of branch portions, and each of the plurality of twig portions include one or more light-emitting diodes.

2. The system of claim 1, wherein each of the one or more light-emitting diodes includes a first light-emitting diode chip having a first polarity and a second light-emitting diode chip connected in series with the first light-emitting diode chip, the second light-emitting diode chip having a second polarity opposite the first polarity.

3. The system of claim 2, wherein the first light-emitting diode chip is configured to emit light of a first wavelength in response to the power flow in the first direction, and wherein the second light-emitting diode chip is configured to emit light of a second wavelength different from the first wavelength in response to the power flow in the second direction.

4. The system of claim 3, wherein the first wavelength of light emitted by the first light-emitting diode chip is associated with a first pattern and the second wavelength of light emitted by the second light-emitting diode chip is associated with a second pattern different from the first pattern.

5. The system of claim 3, wherein the first wavelength of light emitted by the first light-emitting diode chip is a white light and the second wavelength of light emitted by the second light-emitting diode chip is a non-white light.

6. The system of claim 2, wherein the first light-emitting diode chip is only configured to emit light in response to the power flow in the first direction, and wherein the second light-emitting diode chip is only configured to emit light in response to the power flow in the second direction.

7. The system of claim 2, wherein the A/B switch includes a timer configured to change between an on state and an off state, wherein in the on state the timer is configured to cause the A/B switch to switch the power flow to the first direction, and wherein in the off state the timer is configured to cause the A/B switch to switch the power flow to the second direction.

8. The system of claim 2, wherein the first light-emitting diode chip and the second light-emitting diode chip of each of the one or more light-emitting diodes of the trunk portion are of a first type.

9. The system of claim 8, wherein the first light-emitting diode chip and the second light-emitting diode chip of each of the one or more light-emitting diodes of each of the plurality of branch portions is of a second type different from the first type.

10. The system of claim 9, wherein the first light-emitting diode chip and the second light-emitting diode chip of each of the one or more light-emitting diodes of each of the plurality of twig portions is of a third type different from the first type and the second type.

11. A system comprising:
a power terminal configured to produce a power flow through a wire;
a first inline connector and a second inline connector attached to the wire, wherein the wire is connected to the power terminal by the first inline connector and the second inline connector, wherein a direction of the power flow through the wire is switched between a first direction and a second direction opposing the first direction by changing a connection of the first inline connector and the second inline connector with the power terminal; and
a support apparatus configured to encapsulate the wire, the support apparatus including:
a trunk portion;
a plurality of branch portions connected to the trunk portion; and
a plurality of twig portions connected to the plurality of branch portions, wherein the trunk portion, each of the plurality of branch portions, and each of the plurality of twig portions include one or more light-emitting diodes.

12. The system of claim 11, wherein each of the one or more light-emitting diodes includes a first light-emitting diode chip having a first polarity and a second light-emitting diode chip connected in series with the first light-emitting diode chip, the second light-emitting diode chip having a second polarity opposite the first polarity.

13. The system of claim 12, wherein the first light-emitting diode chip is configured to emit light of a first wavelength in response to the power flow in the first direction, and wherein the second light-emitting diode chip is configured to emit light of a second wavelength different from the first wavelength in response to the power flow in the second direction.

14. The system of claim 13, wherein the first wavelength of light emitted by the first light-emitting diode chip is associated with a first pattern and the second wavelength of light emitted by the second light-emitting diode chip is associated with a second pattern different from the first pattern.

15. A support apparatus configured to encapsulate a wire, the support apparatus including:
a trunk portion;
a plurality of branch portions connected to the trunk portion; and
a plurality of twig portions connected to the plurality of branch portions,
wherein the trunk portion, each of the plurality of branch portions, and each of the plurality of twig portions include one or more light-emitting diodes.

16. The support apparatus of claim 15, wherein each of the one or more light-emitting diodes includes a first light-emitting diode chip having a first polarity and a second light-emitting diode chip connected in series with the first light-emitting diode chip, the second light-emitting diode chip having a second polarity opposite the first polarity.

17. The support apparatus of claim 16, wherein the first light-emitting diode chip is configured to emit light of a first wavelength in response to a power flow in a first direction, and wherein the second light-emitting diode chip is configured to emit light of a second wavelength different from the first wavelength in response to the power flow in a second direction.

18. The support apparatus of claim 17, wherein the first wavelength of light emitted by the first light-emitting diode chip is associated with a first pattern and the second wavelength of light emitted by the second light-emitting diode chip is associated with a second pattern different from the first pattern.

19. The support apparatus of claim 17, wherein the first wavelength of light emitted by the first light-emitting diode chip is a white light and the second wavelength of light emitted by the second light-emitting diode chip is a non-white light.

20. The support apparatus of claim 16, wherein the first light-emitting diode chip is only configured to emit light in response to a power flow in a first direction, and wherein the second light-emitting diode chip is only configured to emit light in response to the power flow in a second direction.

* * * * *